(12) United States Patent
Yang et al.

(10) Patent No.: US 9,214,584 B2
(45) Date of Patent: Dec. 15, 2015

(54) SOLAR CELL, METHOD FOR MANUFACTURING DOPANT LAYER, AND METHOD FOR MANUFACTURING SOLAR CELL

(75) Inventors: Youngsung Yang, Seoul (KR); Yongduk Jin, Seoul (KR); Manhyo Ha, Seoul (KR); Juhwa Cheong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 355 days.

(21) Appl. No.: 13/611,995

(22) Filed: Sep. 12, 2012

(65) Prior Publication Data

US 2013/0298974 A1    Nov. 14, 2013

(30) Foreign Application Priority Data

May 11, 2012  (KR) ........................ 10-2012-0050314

(51) Int. Cl.
  *H01L 31/18*   (2006.01)
  *H01L 31/0352*  (2006.01)
  *H01L 31/068*   (2012.01)

(52) U.S. Cl.
  CPC ........ *H01L 31/03529* (2013.01); *H01L 31/068* (2013.01); *H01L 31/18* (2013.01); *H01L 31/1804* (2013.01); *Y02E 10/547* (2013.01)

(58) Field of Classification Search
  USPC ..................... 438/87, 98, 519, 527
  See application file for complete search history.

(56) References Cited

U.S. PATENT DOCUMENTS

| | | | | |
|---|---|---|---|---|
| 3,471,924 A * | 10/1969 | Iles | ................. | 438/57 |
| 3,966,499 A * | 6/1976 | Yasui et al. | ................... | 136/206 |
| 4,053,918 A * | 10/1977 | Fletcher et al. | .............. | 136/255 |
| 4,341,918 A * | 7/1982 | Evans et al. | ................... | 136/249 |
| 4,608,452 A * | 8/1986 | Weinberg et al. | ............. | 136/261 |
| 5,609,694 A * | 3/1997 | Asai | .............................. | 136/255 |
| 6,130,380 A * | 10/2000 | Nakamura | .................... | 136/255 |
| 8,129,614 B2 * | 3/2012 | Walukiewicz et al. | ........ | 136/261 |
| 8,134,217 B2 * | 3/2012 | Rim et al. | ..................... | 257/431 |
| 8,580,599 B2 * | 11/2013 | Rim et al. | ...................... | 438/59 |
| 8,647,911 B2 * | 2/2014 | Smith | ............................ | 438/57 |
| 8,709,853 B2 * | 4/2014 | Komatsu et al. | ................ | 438/71 |
| 2008/0092944 A1 * | 4/2008 | Rubin | .......................... | 136/252 |
| 2008/0314447 A1 * | 12/2008 | Walukiewicz et al. | ........ | 136/261 |
| 2009/0020156 A1 * | 1/2009 | Ohtsuka et al. | ............... | 136/256 |
| 2009/0173373 A1 * | 7/2009 | Walukiewicz et al. | ........ | 136/244 |
| 2010/0154883 A1 * | 6/2010 | Komatsu et al. | ............... | 136/256 |
| 2010/0184250 A1 * | 7/2010 | Blake et al. | ..................... | 438/72 |
| 2010/0275982 A1 * | 11/2010 | Abbott et al. | .................. | 136/255 |
| 2011/0056532 A1 * | 3/2011 | Ravi et al. | ...................... | 136/244 |
| 2011/0162703 A1 * | 7/2011 | Adibi et al. | .................... | 136/256 |
| 2012/0009721 A1 * | 1/2012 | Abbott et al. | ................... | 438/72 |
| 2012/0073650 A1 * | 3/2012 | Smith et al. | .................... | 136/258 |
| 2012/0171799 A1 * | 7/2012 | Rim et al. | ....................... | 438/59 |
| 2012/0260989 A1 * | 10/2012 | DeLuca | ........................ | 136/261 |

(Continued)

OTHER PUBLICATIONS

Gee J M et al.: "Emitter Wrap-Through Solar Cell", Proceedings of the Photovoltaic Specialists Conference. Louisville, May 10-14, 1993; New York IEEE, US, vol. Conf. 23, May 10, 1993, pp. 265-270, XP010113396.

*Primary Examiner* — Earl Taylor
(74) *Attorney, Agent, or Firm* — Dentons US LLP

(57) ABSTRACT

In a method of manufacturing a solar cell includes forming a dopant layer by doping a dopant of a first conductive type and a counter dopant of a second conductive type opposite to the first conductive type to a surface of a semiconductor substrate. Here, a doping amount of the counter dopant is less than a doping amount of the dopant.

18 Claims, 9 Drawing Sheets

(56) References Cited

U.S. PATENT DOCUMENTS

2013/0081677 A1* 4/2013 Loscutoff et al. ............. 136/252
2013/0139884 A1* 6/2013 Lee et al. ..................... 136/258
2013/0153018 A1* 6/2013 Lee et al. ..................... 136/256
2013/0164887 A1* 6/2013 Lee et al. ...................... 438/98
2013/0267059 A1* 10/2013 Kim et al. ..................... 438/87
2013/0298973 A1* 11/2013 Xie et al. ..................... 136/255
2013/0298974 A1* 11/2013 Yang et al. ................... 136/255
2013/0298975 A1* 11/2013 Yang et al. ................... 136/255

* cited by examiner

SOLAR CELL, METHOD FOR MANUFACTURING DOPANT LAYER, AND METHOD FOR MANUFACTURING SOLAR CELL

CROSS-REFERENCE TO RELATED APPLICATION

This application claims the priority benefit of Korean Patent Application No. 10-2012-0050314, filed on May 11, 2012 in the Korean Intellectual Property Office, the disclosure of which is incorporated herein by reference.

BACKGROUND OF THE DISCLOSURE

1. Field of the Disclosure

The disclosure relates to a solar cell, a method for manufacturing a dopant layer, and a method for manufacturing a solar cell. More particularly, the disclosure relates to a solar cell including a dopant layer, and a method for manufacturing the dopant layer and a method for manufacturing a solar cell including the same.

2. Description of the Related Art

Recently, as existing energy resources such as oil or coal are expected to be exhausted, an interest in alternative energy for replacing oil or coal is increasing. In particular, a solar cell that directly converts or transforms solar energy into electricity using a semiconductor element is gaining attention.

In a solar cell, a p-n junction is formed by forming a dopant layer in order to induce photoelectric conversion, and an electrode electrically connected to the dopant layer is formed. When a doping amount increases so that the doping layer can have a sufficient thickness, surface recombination of electrons and holes at the dopant layer may increase. Thus, it is difficult to increase a thickness of the dopant layer and reduce the surface recombination at the same time.

SUMMARY

Embodiments of the invention is directed to provide a method for manufacturing a dopant layer being able to have a sufficient thickness and to prevent surface recombination of electrons and holes, and to provide a method for manufacturing a solar cell including the dopant layer.

Also, embodiments of the invention is directed to provide a solar cell including a dopant layer being able to have a sufficient thickness and to prevent surface recombination of electrons and holes.

In a method of manufacturing a solar cell according to an embodiment of the invention, a dopant layer is formed by doping a dopant of a first conductive type and a counter dopant of a second conductive type opposite to the first conductive type to a surface of a semiconductor substrate. Here, a doping amount of the counter dopant is less than a doping amount of the dopant.

A solar cell according to an embodiment includes: a semiconductor substrate; a dopant layer formed at a surface of the semiconductor substrate; and an electrode electrically connected to the dopant layer. Here, the dopant layer includes a dopant of a first conductive type and a counter dopant of a second conductive type opposite to the first conductive type. Also, a doping concentration of the counter dopant is less than a doping concentration of the dopant.

DETAILED DESCRIPTION OF THE EMBODIMENTS

Figure 1:
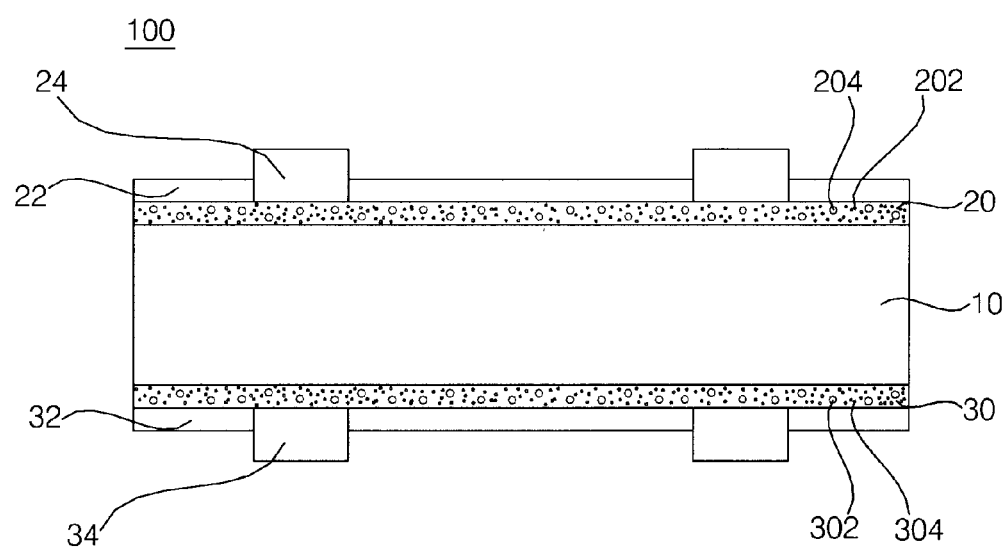
FIG. 1 is a cross-sectional view of a solar cell according to an embodiment of the invention.

Hereinafter, embodiments of the invention will be described with reference to the accompanying drawings. However, the invention is not limited the embodiments, and the various modifications of the embodiments are possible.

In order to clearly and concisely illustrate the embodiments of the invention, elements not related to the invention may be omitted in the figures. Also, elements similar to or the same as each other may have the same reference numerals. In addition, the dimensions of layers and regions may be exaggerated or schematically illustrated, or some layers may be omitted for clarity of illustration. In addition, the dimension of each part as drawn may not reflect an actual size.

In the following description, when a layer or substrate "includes" another layer or portion, it can be understood that the layer or substrate further includes still another layer or portion. Also, when a layer or film is referred to as being "on" another layer or substrate, it can be understood that the layer of film is directly on the other layer or substrate, or intervening layers are also be present. Further, when a layer or film is referred to as being "directly on" another layer or substrate, it can be understood that the layer or film is directly on the another layer or substrate, and thus, there is no intervening layer.

Hereinafter, a method for manufacturing a dopant layer and a method for a solar cell including the same, and a solar cell manufactured by the method for manufacturing the solar cell according to embodiments of the invention will be described with reference to the accompanying drawings.

Figure 2:
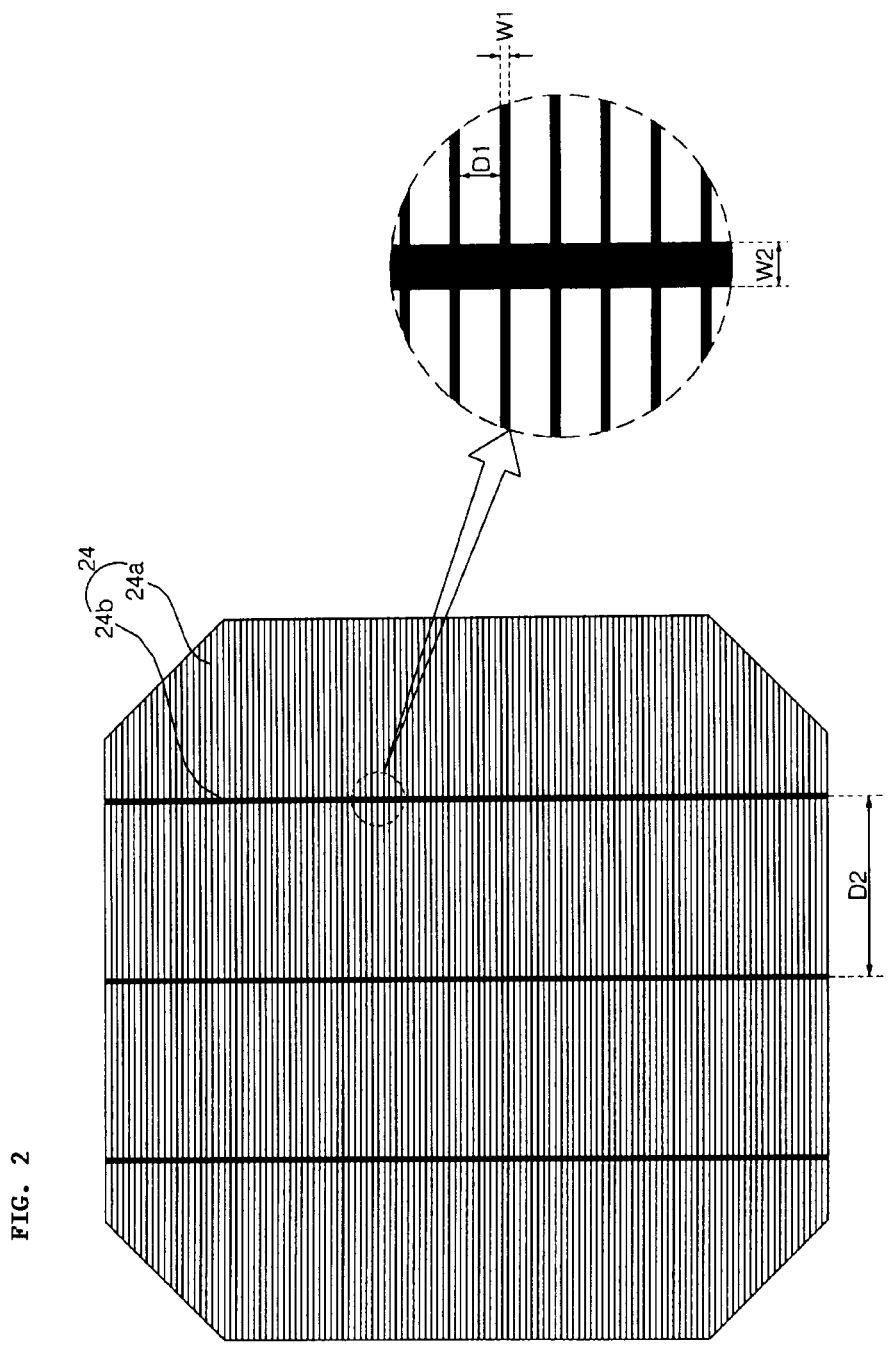
FIG. 2 is a plan view schematically illustrating a first electrode of the solar cell shown in FIG. 1.

FIG. 1 is a cross-sectional view of a solar cell according to an embodiment of the invention, and FIG. 2 is a plan view schematically illustrating a first electrode of the solar cell shown in FIG. 1.

Referring to FIGS. 1 and 2, a solar cell 100 according to the embodiment includes a semiconductor substrate 10, dopant layers 20 and 30 formed at the semiconductor substrate 10, and electrodes 24 and 34 electrically connected to the semiconductor substrate 10 or the dopant layers 20 and 30. More specifically, the dopant layer 20 and 30 may include a first dopant layer (hereinafter, referred to as "an emitter layer") 20 formed at or adjacent to a first surface (hereinafter, referred to as "a front surface") of the semiconductor substrate 10, and a second dopant layer (hereinafter, referred to as "a back surface field layer") 30 formed at or adjacent to a second surface (hereinafter, referred to as "a back surface") of the semiconductor substrate 10. Also, the electrodes 24 and 34 may include a first electrode (or a plurality of first electrodes) (hereinafter, referred to as "a first electrode") 24 electrically connected to the emitter layer 20, and a second electrode (or a plurality of second electrodes) (hereinafter, referred to as "a second electrode") 34 electrically connected to the semiconductor substrate 10 or the back surface field layer 30. In addition, the solar cell 100 may further include an anti-reflection layer 22 and a passivation layer 32. This will be described in more detail.

The semiconductor substrate 10 may include one or more of various semiconductor materials. For example, the semiconductor substrate 10 includes silicon having a dopant of the second conductivity type. Single crystal silicon or polycrystalline silicon may be used for the silicon, and the second conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, and thereby forming a p-n junction. When the sun light is incident to the p-n junction, the electrons generated by the photoelectric effect moves to the back surface of the semiconductor substrate 10 and are collected by the second electrode 34, and the holes generated by the photoelectric effect moves to the front surface of the semiconductor substrate 10 and are collected by the first electrode 24. Then, the electric energy is generated.

Here, the holes having mobility lower than that of the electrodes move to the front surface of the semiconductor substrate 10, and not the back surface of the semiconductor substrate 10. Therefore, the conversion efficiency of the solar cell 100 can be enhanced.

Although it is not shown, the front and/or back surfaces of the semiconductor substrate 10 may be a textured surface to have protruded and/or depressed portions of various shapes (such as pyramid shape). Thus, the surface roughness is increased by the protruded and/or depressed portions, and reflectance of the incident sun light at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 100. However, the invention is not limited thereto, and thus, the protruded and/or depressed portions may be formed only at the front surface, or there may be no protruded and/or depressed portions at the front and back surfaces.

The emitter layer 20 of the first conductive type may be formed at the front surface of the semiconductor substrate 10. Here, the emitter layer 20 may include a first dopant 202 of the first conductive type and a first counter dopant 204 of the second conductive type opposite to the first conductive type.

A p-type dopant such as a group III element (for example, boron (B), aluminum (Al), gallium (Ga), indium (In) or the like) may be used for the first dopant 202. A n-type dopant such as a group V element (for example, phosphorus (P), arsenic (As), bismuth (Bi), antimony (Sb), or the like) may be used for the first counter dopant 204. However, the invention is not limited thereto, and thus, the first dopant 202 and the first counter dopant 204 may be formed of one or more of various elements or materials.

In the embodiment, the emitter layer 20 as the dopant layer includes the first counter dopant 204, along with the first dopant 202. Accordingly, a sufficient junction depth can be achieved, and the recombination velocity can be reduced by decreasing the surface concentration of the emitter layer 20. More particularly, when the surface concentration of the emitter layer 20 decreases and a shallow emitter is achieved, the current density can be increased. However, if the doping amount of the first dopant 20 is decreased in order to achieve the shallow emitter, the junction depth is not sufficient. Therefore, in the embodiment, the sufficient junction depth can be achieved by doping a lot of the first dopant 202, and the shallow emitter can be achieved by reducing the surface concentration of the emitter layer 20 through doping the first counter dopant 204 having a conductive type different from the first dopant 202.

That is, in the embodiment, the recombination velocity can be reduced by the shallow emitter and the sufficient junction depth can be achieved. As a result, efficiency of the solar cell 100 can be enhanced.

For example, the emitter layer 20 may have sheet resistance of about 50~150 ohm/square (ohm/□), and may have a thickness of about 0.3~1.5 μm (for example, 0.5~1.2 μm). However, the invention is not limited thereto. Thus, the sheet resistance and the thickness of the emitter layer 20 may be changed.

Here, a doping concentration of the first counter dopant 204 is less than a doping concentration of the first dopant 202, and the emitter layer 20 has the first conductive type. For example, the ratio of the doping concentration of the first counter dopant 204: the doping concentration of the first dopant 202 may be about 1:3 to 1:30. When the ratio is above 1:30, the reduction of the surface concentration due to the first counter dopant 204 may be small. When the ratio is below 1:3, the property of the emitter layer 20 may be deteriorated. Here, when the doping concentration of the first counter dopant 204: the ratio of the doping concentration of the first dopant 202 is about 1:5 to 1:15, the first counter dopant 204 has a great effect.

The concentration difference between the first counter dopant 204 and the first dopant 202 may originate in a doping amount difference between the first counter dopant 204 and the first dopant 202. In this case, the doping amount of the first counter dopant 204 and the first dopant 202 can be detected by secondary ion mass spectroscopy (SIMS) and so on. In the embodiment, the emitter layer 20 includes the first counter dopant 204, and thus, the concentration of the elements of the second conductive type at the emitter layer 20 is larger than that at a portion of the semiconductor substrate 10 where the emitter layer 20 and the back surface field layer 30 are not formed.

The anti-reflection layer 22 and the first electrode 24 may be formed on the emitter layer 20 at the front surface of the semiconductor substrate 10.

The anti-reflection layer 22 may be substantially at the entire front surface of the semiconductor substrate 10, except for the portion where the first electrode 24 is formed. The anti-reflection layer 22 reduces reflectance (or reflectivity) of sun light incident to the front surface of the semiconductor substrate 10. Thus, an amount of the sun light reaching the p-n junction formed between the semiconductor substrate 10 and the emitter layer 20 can be increased, thereby increasing short circuit current (Isc) of the solar cell 100.

Also, the anti-reflection layer 22 passivates defects at a surface or a bulk of the emitter layer 20. Thus, the defects at the emitter layer 20 are passivated, and recombination sites of minority carrier are reduced or eliminated, thereby increasing an open-circuit voltage (Voc) of the solar cell 100. Accordingly, the open-circuit voltage and the short-circuit current of the solar cell 100 can be increased by the anti-reflection layer 22, and thus, the efficiency of the solar cell 100 can be enhanced.

The anti-reflection layer 22 may include one or more of various materials. For example, the anti-reflection layer 22 may include a silicon nitride layer. However, the invention is not limited thereto. Thus, the anti-reflection layer 22 may have a single film structure or a multi-layer film structure including, for example, at least one material selected from a group including silicon nitride, silicon nitride including hydrogen, silicon oxide, silicon oxy nitride, $MgF_2$, ZnS, $TiO_2$ and $CeO_2$.

The first electrode 24 is electrically connected to the emitter layer 20 by penetrating the anti-reflection layer 22 at the front surface of the semiconductor substrate 10. The first electrode 24 in plan view may have various shapes. For example, as shown in FIG. 2, the first electrode 24 may include a plurality of finger electrodes 24a. The finger electrodes 24a are parallel to each other and are spaced apart from each other with a first distance D1. Also, the first electrode 24 may include a bus bar electrode 24b extending in a direction crossing the finger electrodes 24a to connect to the finger electrodes 24a. The bus bar electrode 24b may include a single bus bar electrode 24b, or the bus bar electrode 24b may include a plurality of bus bar electrodes 24b as shown in FIG. 2. The plurality of bus bar electrodes 24b are spaced apart from each other with a second distance D2 that is larger than the first distance D1. Here, a width W1 of the finger electrode 24a may be smaller than a width W2 of the bus bar electrode 24b. However, the invention is not limited thereto, and thus, the width W1 of the finger electrode 24a may be the same as the width W2 of the bus bar electrode 24b. That is, the shape of the first electrode 24 is described as an example, and thus, the invention is not limited thereto. Also, the first electrode 24 may include one or more of various materials.

Referring to FIG. 1 again, the back surface field layer 30 of the second conductive type is formed at the back surface of the semiconductor substrate 10. Here, the back surface field layer 30 may include a second dopant 302 of the second conductive type and a second counter dopant 304 of the first conductive type opposite to the second conductive type.

A n-type dopant such as a group V element (for example, phosphorus (P), arsenic (As), bismuth (Bi), antimony (Sb), or the like) may be used for the second dopant 302. A p-type dopant such as a group III element (for example, boron (B), aluminum (Al), gallium (Ga), indium (In) or the like) may be used for the second counter dopant 304. However, the invention is not limited thereto, and thus, the second dopant 302 and the second counter dopant 304 may be formed of one or more of various elements or materials.

In the embodiment, the back surface field layer 30 as the dopant layer includes the second counter dopant 304, along with the second dopant 302. Accordingly, the back surface field layer 30 can have a sufficient thickness, and the recombination velocity can be reduced by decreasing the surface concentration of the back surface field layer 30.

For example, the back surface field layer 30 may have sheet resistance of about 50~150 ohm/square (ohm/□), and may have a thickness of about 0.3~1.5 μm (for example, 0.5~1.2 μm). However, the invention is not limited thereto. Thus, the sheet resistance and the thickness of the back surface field layer 30 may be changed.

Here, a doping concentration of the second counter dopant 304 is less than a doping concentration of the second dopant 302, and the back surface field layer 30 has the second conductive type. For example, the ratio of the doping concentration of the second counter dopant 304: the doping concentration of the second dopant 302 may be about 1:3 to 1:30. When the ratio is above 1:30, the reduction of the surface concentration due to the second counter dopant 304 may be small. When the ratio is below 1:3, the property of the back surface field layer 30 may be deteriorated. Here, when the ratio of the doping concentration of the second counter dopant 304: the doping concentration of the second dopant 302 is about 1:5 to 1:15, the second counter dopant 304 has a great effect.

The concentration difference between the second counter dopant 304 and the second dopant 302 may originate in a doping amount difference between the second counter dopant 304 and the second dopant 302. In this case, the doping amount of the second counter dopant 304 and the second dopant 302 can be detected by secondary ion mass spectroscopy and so on.

The passivation layer 32 and the second electrode 34 may be formed at the back surface of the semiconductor substrate 10.

The passivation layer 32 may be substantially at the entire back surface of the semiconductor substrate 10, except for the portions where the second electrode 34 is formed. The passivation layer 32 passivates defects at the back surface of the semiconductor substrate 10, and eliminates the recombination sites of minority carrier. Thus, an open circuit voltage (Voc) of the solar cell 100 can be increased.

The passivation layer 32 may include a transparent insulating material for passing light. Thus, the light can be incident to the back surface of the semiconductor substrate 10 through the passivation layer 32, and thereby enhancing the efficiency of the solar cell 100. The passivation layer 32 may have a single film structure or a multi-layer film structure including, for example, at least one material selected from a group including silicon nitride, silicon nitride including hydrogen, silicon oxide, silicon oxy nitride, $MgF_2$, ZnS, $TiO_2$ and $CeO_2$. However, the invention is not limited thereto, and thus, the passivation film 32 may include one or more of various materials.

The second electrode may include a metal having a high electric conductivity. Also, the second electrode 34 may have a structure similar to the structure of the first electrode 24 shown in FIG. 2, and thus, the descriptions of the detailed structure of the second electrode 34 will be omitted.

Likewise, the emitter layer 20 includes the first dopant 202 and the first counter dopant 204, and the back surface field layer 30 includes the second dopant 302 and the second counter dopant 304. Accordingly, each of the emitter layer 20 and the back surface field layer 30 can have sufficient thicknesses, and the recombination velocity can be reduced by decreasing the surface concentration of the emitter layer 20 and the back surface field layer 30. Accordingly, the efficiency of the solar cell 100 can be maximized. In the above embodiment, the semiconductor substrate 10 and the back surface field layer 30 have the n-type dopant for the second dopant 302, and the emitter layer 20 has the p-type dopant for the first dopant 202. However, the present invention is not limited thereto. Therefore, it is possible that the semiconductor substrate 10 and the back surface field layer 30 have the p-type dopant for the second dopant 302 and the emitter layer 20 has the n-type dopant for the first dopant 202.

Also, in the above embodiment, the emitter layer 20 includes the first counter dopant 204 and the back surface field layer 30 includes the second counter dopant 304. However, the present invention is not limited thereto. Thus, it is possible that the emitter layer 20 includes the first counter dopant 204 and the back surface field layer 30 does not include the second counter dopant 304. In addition, it is possible that the emitter layer 20 does not include the first counter dopant 204 and the back surface field layer 30 includes the second counter dopant 304.

In the above embodiment, the first dopant 202 and the first counter dopant 204 are doped with a uniform doping concentration at the entire emitter layer 20, and the second dopant 302 and the second counter dopant 304 are doped with a uniform doping concentration at the entire back surface field layer 30. However, the invention is not limited thereto. Therefore, the emitter layer 20 may include portions where the concentration of at least one the first dopant 202 and the first counter dopant 204 are different, and the back surface field layer 30 may include portions where the concentration of at least one the second dopant 302 and the second counter dopant 304 are different. Also, the emitter layer 20 and/or the back surface field layer 30 may be locally formed.

Hereinafter, a method for manufacturing the solar cell 100 including the dopant layer according to an embodiment of the invention will be described with reference to FIGS. 3a to 3g. In the following description, the described portions in the above may be omitted, and the not-described portions in the above will be described in detail.

FIGS. 3a to 3g are cross-sectional views for illustrating a method of manufacturing a solar cell according to an embodiment of the present invention.

Figure 3A:
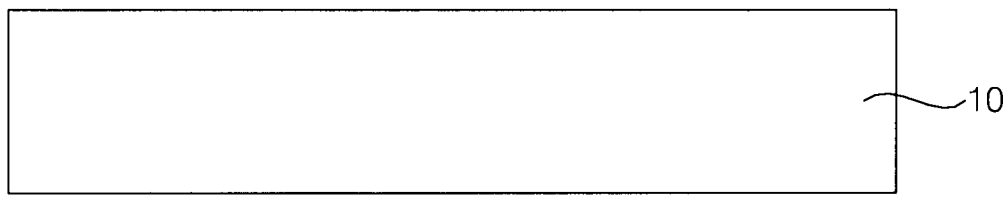
FIGS. 3a to 3g are cross-sectional views for illustrating a method for manufacturing a solar cell according to an embodiment of the invention.

First, as shown in FIG. 3a, a semiconductor substrate 10 of a second conductive type is prepared. Although it is not shown in drawings, the front and back surfaces of the semiconductor substrate 10 may be textured to have protruded and/or depressed portions of various shapes (or to have an uneven surface). For the texturing method, a wet etching method or a dry etching method may be used. In the wet etching method, the substrate 10 may be dipped into a texturing solution. According to the wet etching method, the process time can be short. In the dry etching method, the surface of the semiconductor substrate 10 may be etched by a diamond drill or a laser. In the dry etching, the protruded and/or depressed portions can be uniformly formed; however, the semiconductor substrate 10 may be damaged and the process time may be long. Accordingly, the semiconductor substrate 10 may be textured by one or more methods of various methods.

Next, as shown in FIGS. 3b to 3e, an emitter layer 20 and a back surface field layer 30 are formed at the semiconductor substrate 10.

Figure 3B:
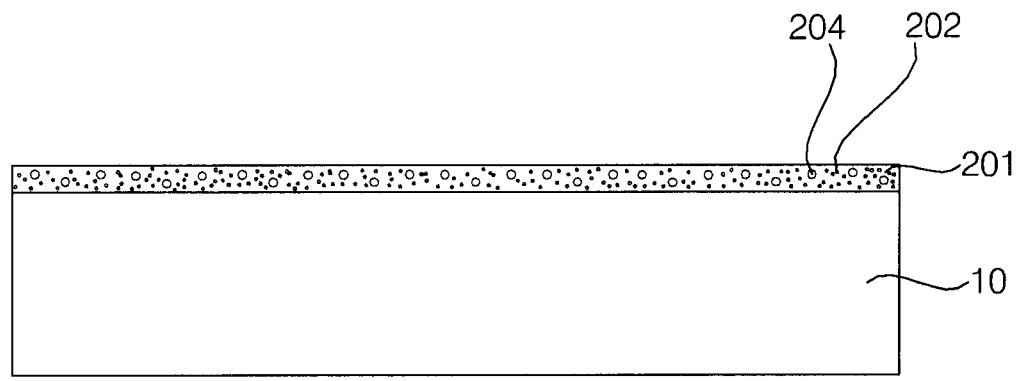

For example, as shown in FIG. 3b, a layer 201 for forming the emitter layer 20 is formed by doping a first dopant 202 and a first counter dopant 204 to the front surface of the semiconductor substrate 10. The first counter dopant 204 may be doped after the first dopant 202 is doped. Selectively, the first dopant 202 may be doped after the first counter dopant 204 is doped.

For the doping methods, one or more of various methods may be used. For example, an ion-implantation method may be used. Here, the ratio of a doping amount (dose) of the first counter dopant 204: a doping amount of the first dopant 202 is about 1:3 to 1:30. When the ratio is above 1:30, the reduction of the surface concentration due to the first counter dopant 204 may be small. When the ratio is below 1:3, the property of the emitter layer 20 may be deteriorated. Here, when the ratio of the doping concentration of the first counter dopant 204: the doping concentration of the first dopant 202 is about 1:5 to 1:15, the first counter dopant 204 has a great effect.

An ion-implanting energy of the first counter dopant 204 may be less than an ion-implanting energy of the first dopant 202. Also, when the second dopant 302 is doped by an ion-implantation method, an ion-implanting energy of the first counter dopant 204 may be less than an ion-implanting energy of a second dopant 302. By reducing the ion-implanting energy of the first counter dopant 204, the damage due to the first counter dopant 204 can be minimized. Accordingly, the property of the solar cell 100 can be enhanced.

Figure 3C:
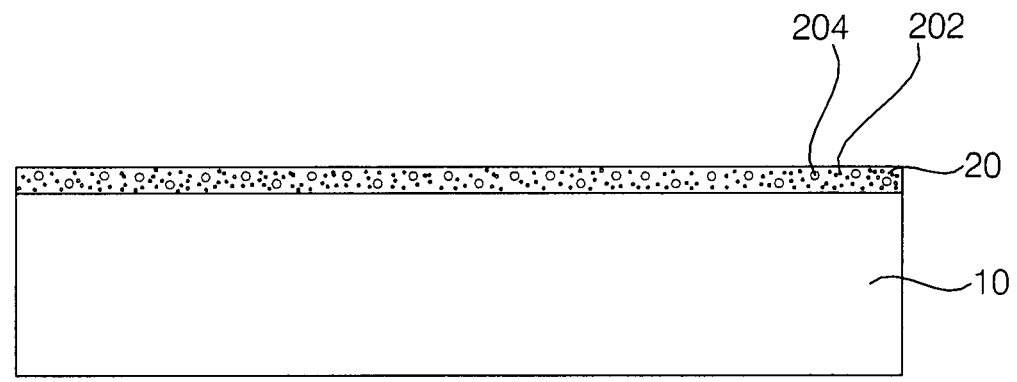

Next, as shown in FIG. 3c, the semiconductor substrate 10 is heat-treated for activation, and an emitter layer 20 is formed. After the ion-implanting of the first dopant 202 and the first counter dopant 204, the ion-implanted dopant is not activated since the dopant is not positioned at the lattice sites. By annealing of the semiconductor substrate 10, the first dopant 202 and the first counter dopant 204 move to the lattice sites and are activated. By the activation, the emitter layer 20 is formed from the layer 201 formed at the front surface of the semiconductor substrate 10.

Since the first dopant 202 and the first counter dopant 204 are activated in the same heat-treatment process, the doping concentration is generally lowered. Specifically, the doping concentration at the surface can be largely reduced. Here, when the first dopant 202 and the first counter dopant 204 are heat-treated for the activation, the doping concentration is gradually lowered from the surface of the semiconductor substrate 10 and toward the inside of the emitter layer 20 in the doping profile.

For reference, when the heat-treatment of the first dopant 202 and the first counter dopant 204 are separately performed, the doping profile has two peak points from the surface of the semiconductor substrate 10 to the inside of the emitter layer 20. This is because the concentration peak point of the first dopant 202 and the concentration peak point of the first counter dopant 204 are different.

Figure 3D:
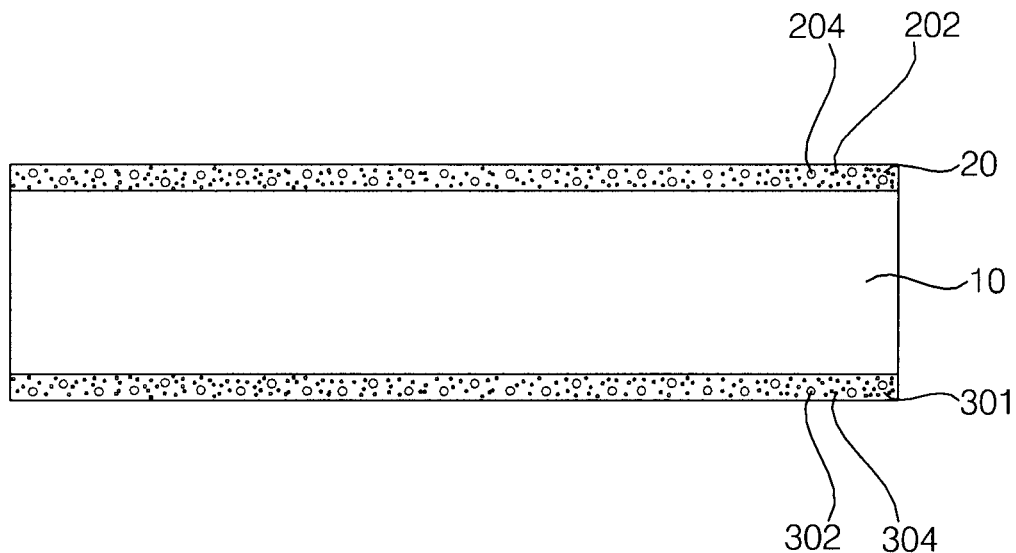

Next, as shown in FIG. 3d, a layer 301 for forming the back surface field layer 30 is formed by doping a second dopant 302 and a second counter dopant 304 to the back surface of the semiconductor substrate 10. The second counter dopant 304 may be doped after the second dopant 302 is doped. Selectively, the second dopant 302 may be doped after the second counter dopant 304 is doped.

For the doping methods, one or more of various methods may be used. For example, an ion-implantation method may be used. Here, the ratio of a doping amount of the second counter dopant 304: a doping amount of the second dopant 302 is about 1:3 to 1:30. When the ratio is above 1:30, the reduction of the surface concentration due to the second counter dopant 304 may be small. When the ratio is below 1:3, the property of the back surface field layer 30 may be deteriorated. Here, when the ratio of the doping concentration of the second counter dopant 304: the doping concentration of the second dopant 302 is about 1:5 to 1:15, the second counter dopant 304 has a great effect.

An ion-implanting energy of the second counter dopant 304 may be less than an ion-implanting energy of the second dopant 302. Also, when the first dopant 202 is doped by an ion-implantation method, an ion-implanting energy of the second counter dopant 304 may be less than an ion-implanting energy of the first dopant 202. By reducing the ion-implanting energy of the second counter dopant 304, the damage due to the second counter dopant 304 can be minimized. Accordingly, the property of the solar cell 100 can be enhanced.

Figure 3E:
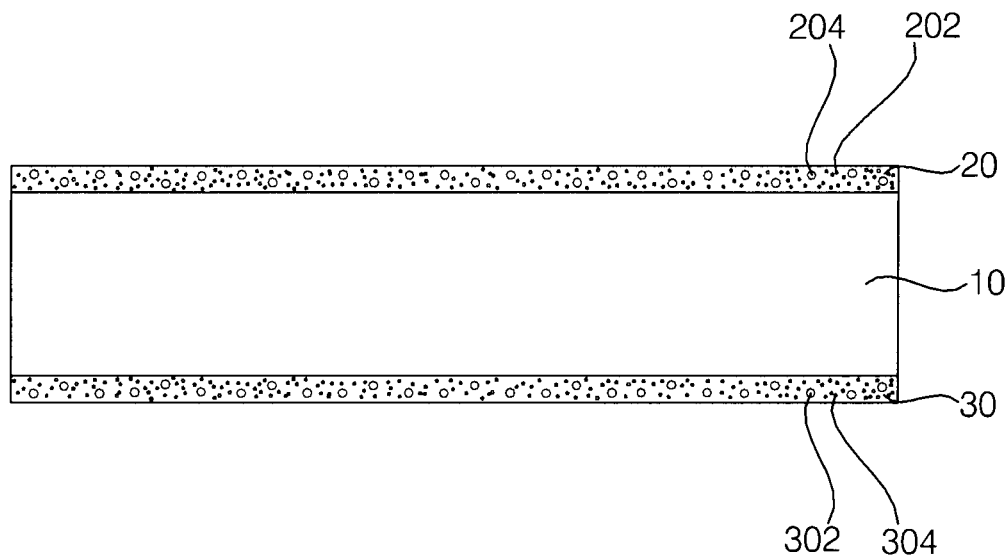

Next, as shown in FIG. 3e, the semiconductor substrate 10 is heat-treated for activation, and the back surface field layer 30 is formed. By the heat-treatment of the semiconductor substrate 10, the second dopant 302 and the second counter dopant 304 are activated, and the back surface field layer 30 is formed from the layer 301.

Since the second dopant 302 and the second counter dopant 304 are activated in the same heat-treatment process, the doping concentration is generally lowered. Specifically, the doping concentration at the surface can be largely reduced. Here, when the second dopant 302 and the second counter dopant 304 are heat-treated for the activation, in the doping profile, the doping concentration is gradually lowered from the surface of the semiconductor substrate 10 and toward the inside of the back surface field layer 30.

In the above embodiment, the emitter layer 20 and the back surface field layer 30 are formed by the ion-implantation method. However, the invention is not limited thereto. Thus, the emitter layer 20 and the back surface field layer 30 may be formed by one or more of various methods. That is, the doping methods of the first dopant 202 and the first counter dopant 204 may be different, and/or the doping methods of the second dopant 302 and the second counter dopant 304 may be different. For example, the first or second dopant 202 or 302 may be doped by the ion-implantation method, and the first or second counter dopant 204 or 304 may be doped by the thermal diffusion method. Selectively, the first or second dopant 204 or 304 may be doped by the thermal diffusion method, and the first or second counter dopant 204 or 304 may be doped by the ion-implantation method. Various other modifications are possible.

Also, in the above embodiment, the heat-treatment for activating the emitter layer 20 and the heat-treatment for activating back surface field layer 30 are separately performed. However, the invention is not limited thereto. Thus, after the first dopant 202 and the first counter dopant 204 for the emitter layer 20 and the second dopant 302 and the second counter dopant 304 for the back surface field layer 30 are doped, the heat-treatment for activating them may be performed at the same time.

In addition, in the above embodiment, after the first dopant 202 and the first counter dopant 204 for the emitter layer 20 are doped, the second dopant 302 and the second counter dopant 304 for the back surface field layer 30 are doped. However, the invention is not limited thereto. Thus, the doping sequence of the first dopant 202, the first counter dopant 204, the second dopant 302, and the second counter dopant 304 may be changed.

Figure 3F:
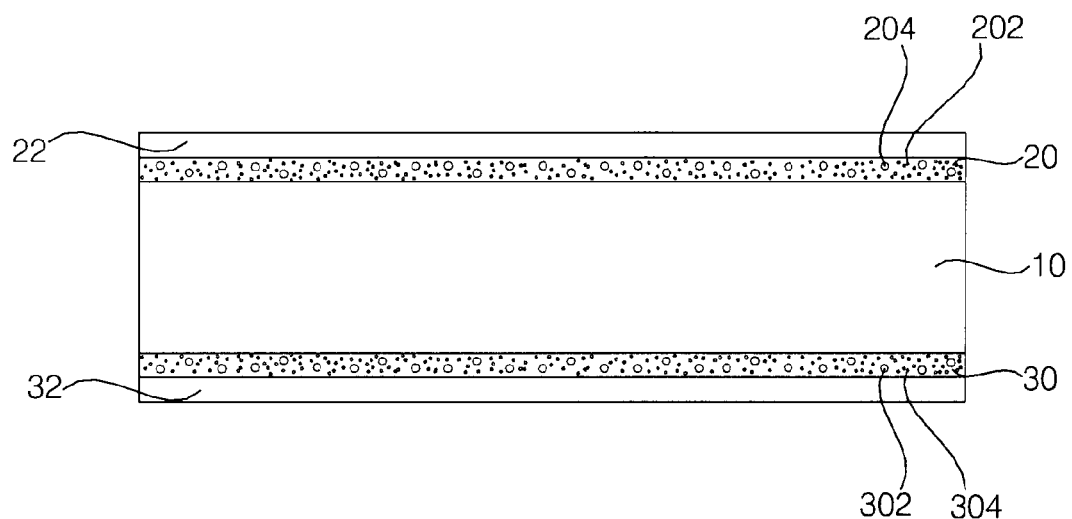

Next, as shown in FIG. 3f, an anti-reflection layer 22 and a passivation layer 32 are formed on the front and back surfaces of the semiconductor substrate 10, respectively. The anti-reflection film 22 and the passivation layer 32 may be formed by one or more of various methods such as a vacuum evaporation method, a chemical vapor deposition method, a spin coating method, a screen printing method, or a spray coating method.

Figure 3G:
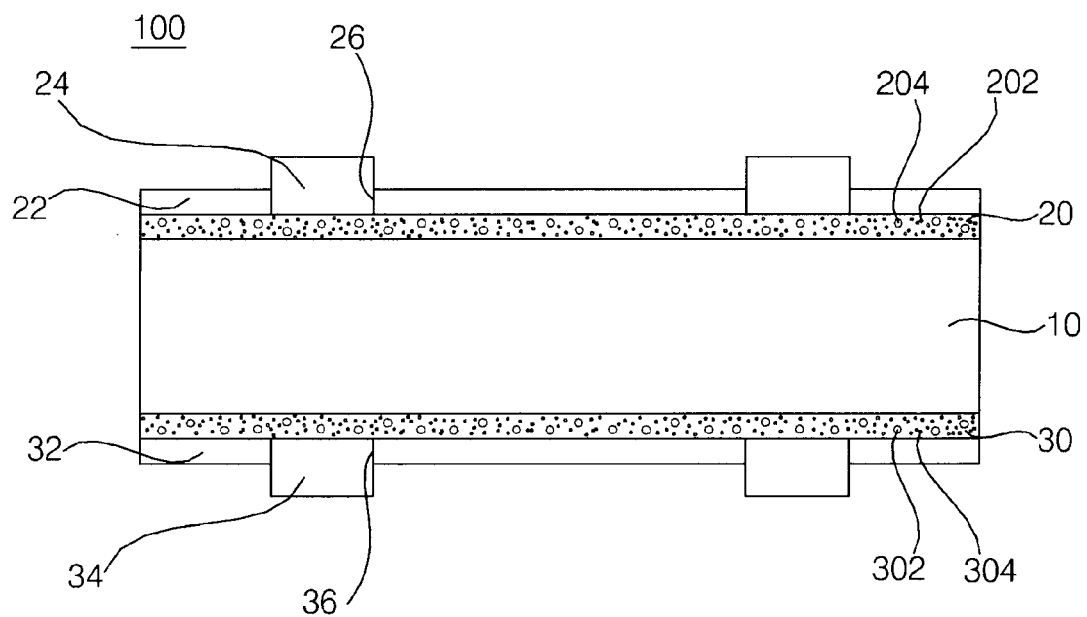

Next, as shown in FIG. 3g, the first electrode 24 electrically connected to the emitter layer 20 is formed at the front surface of the semiconductor substrate 10 and the second electrode 34 electrically connected to the back surface field layer 30 is formed at the back surface of the semiconductor substrate 10.

After forming an opening 26 at the anti-reflection layer 22, the first electrode 24 may be formed inside the opening 26 by one or more of various methods, such as a plating method or a deposition method. Also, after forming an opening 36 at the second passivation layer 32, the second electrode 34 may be formed inside the opening 36 by one or more of various methods, such as a plating method or a deposition method.

Selectively, the first and second electrodes 24 and 34 may be formed by fire-through or laser firing contact of printed pastes for the first and second electrodes 24 and 34. For example, the pastes may be printed by various methods such as a screen printing method. In this case, because the openings 26 and 36 are naturally formed during the fire-through or the laser firing contact, the steps for forming the openings 26 and 36 are not necessary.

Likewise, the emitter layer 20 includes the first dopant 202 and the first counter dopant 204, and thus, a sufficient junction depth can be achieved and the surface concentration at the emitter layer 20 can be reduced. Also, the back surface field layer 30 includes the second dopant 302 and the second counter dopant 304, and thus, the back surface field layer 30 can have a sufficient thickness and the surface concentration at the back surface field layer 30 can be reduced. Accordingly, the surface recombination at the front and back surface of the semiconductor substrate 10, and the efficiency of the solar cell 100 can be enhanced.

Hereinafter, a solar cell including a dopant layer according to other embodiments and a method for the solar cell will be described in detail. In the following description, the described portions in the above may be omitted, and the not-described portions in the above will be described in detail. Also, the modifications in the above embodiments can be applied to the following embodiments.

Figure 4:
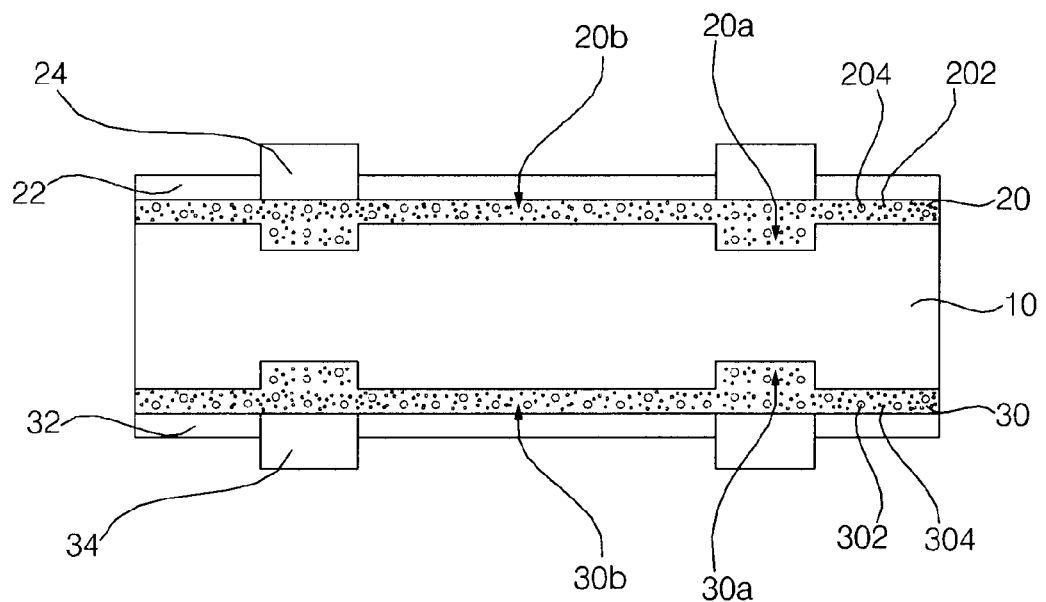
FIG. 4 is a cross-sectional view of a solar cell according to another embodiment of the invention.

FIG. 4 is a cross-sectional view of a solar cell according to another embodiment of the present invention.

Referring to FIG. 4, in the solar cell according to the embodiment, an emitter layer 20 as a first dopant layer has a selective emitter structure, and a back surface field layer 30 as a second first dopant layer has a selective back surface field structure.

Particularly, the emitter layer 20 may include a first portion 20a formed adjacent to and in contact with the first electrode 24, and a second portion 20b other than the first portion 20a.

The first portion 20a has a doping concentration of the first dopant 202 higher than that at the second portion 20b, and thus, the first portion 20a has a resistance lower than that of the second portion 20b. Then, a shallow emitter can be achieved at the second portion 20b where the sun light is incident between the first electrodes 24, and thereby enhancing the current density of the solar cell. In addition, contact resistance with the first electrode 24 can be reduced by forming the first portion 20a with a relatively low resistance at a portion being in contact with the first electrode 24. That is, when the emitter layer 20 has the selective emitter structure, the efficiency of the solar cell can be maximized.

For the above, a doping amount of the first dopant 202 at the first portion 20a is larger than that at the second portion 20b. In order to differentiate the doping amount at the first portion 20a and the second portion 20b, a comb mask may be used. However, the invention is not limited thereto. Thus, a number of doping processes to the first portion 20a may be more than a number of doping processes to the second portion 20b. That is, various methods may be used for forming the selective structure.

Here, in the embodiment, the first counter dopant 204 is entirely doped to the semiconductor substrate 10 with a uniform doping amount.

Also, the back surface field layer 30 may include a first portion 30a formed adjacent to and in contact with the second electrodes 34, and a second portion 30b other than the first portion 30a.

The first portion 30a has a doping concentration of the second dopant 302 higher than that at the second portion 30b, and thus, the first portion 30a has a resistance lower than that of the second portion 30b. Then, the recombination of the electrons and the holes can be prevented by forming the second portion 30b with a relatively high resistance between the second electrode 34, and thereby enhancing the current density of the solar cell. In addition, contact resistance with the second electrode 34 can be reduced by forming the first portion 30a with a relatively low resistance at a portion being in contact with the second electrode 34. That is, when the back surface field layer 30 has the selective back surface field structure, the efficiency of the solar cell can be maximized.

For the above, a doping amount of the second dopant 302 at the first portion 30a is larger than that at the second portion 30b. In order to differentiate the doping amount at the first portion 30a and the second portion 30b, a comb mask may be used. However, the invention is not limited thereto. Thus, a number of doping processes to the first portion 30a may be more than a number of doping processes to the second portion 30b. That is, various methods may be used for forming the selective structure.

Here, in the embodiment, the second counter dopant 304 is entirely doped to the semiconductor substrate 10 with a uniform doping amount.

As such, in the embodiment, the emitter layer 20 and the back surface field layer 30 has the selective structure including portions with different resistance, and thus, the efficiency of the solar cell can be enhanced.

In the embodiment, both of the emitter layer 20 and the back surface field layer 30 have selective structures. However, the invention is not limited thereto. Thus, only one of the emitter layer 20 and the back surface field layer 30 may have a selective structure.

For example, the first portions 20a and 30a of the emitter layer 20 and the back surface field layer 30 may have sheet resistance of about 10~100 ohm/square (for example, about 20~60 ohm/square), and may have a thickness of about 0.5 μm or more (for example, 0.5~1.5 μm). The second portions 20b and 30b of the emitter layer 20 and the back surface field layer 30 may have sheet resistance of about 40~200 ohm/square (for example, 60~150 ohm/square), and may have a thickness smaller than about 0.5 μm (for example, a thickness of about 0.01 μm or less and smaller than about 0.5 μm). However, the invention is not limited thereto. Thus, the sheet resistance and the thickness of the emitter layer 20 and the back surface field layer 30 may be changed.

Figure 5:
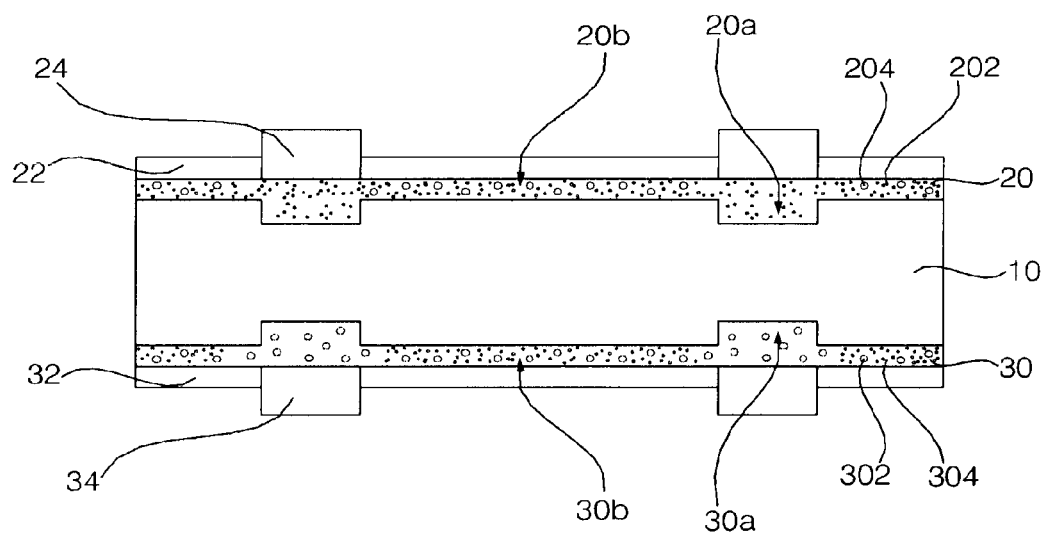
FIG. 5 is a cross-sectional view of a solar cell according to yet another embodiment of the invention.
Figure 6:
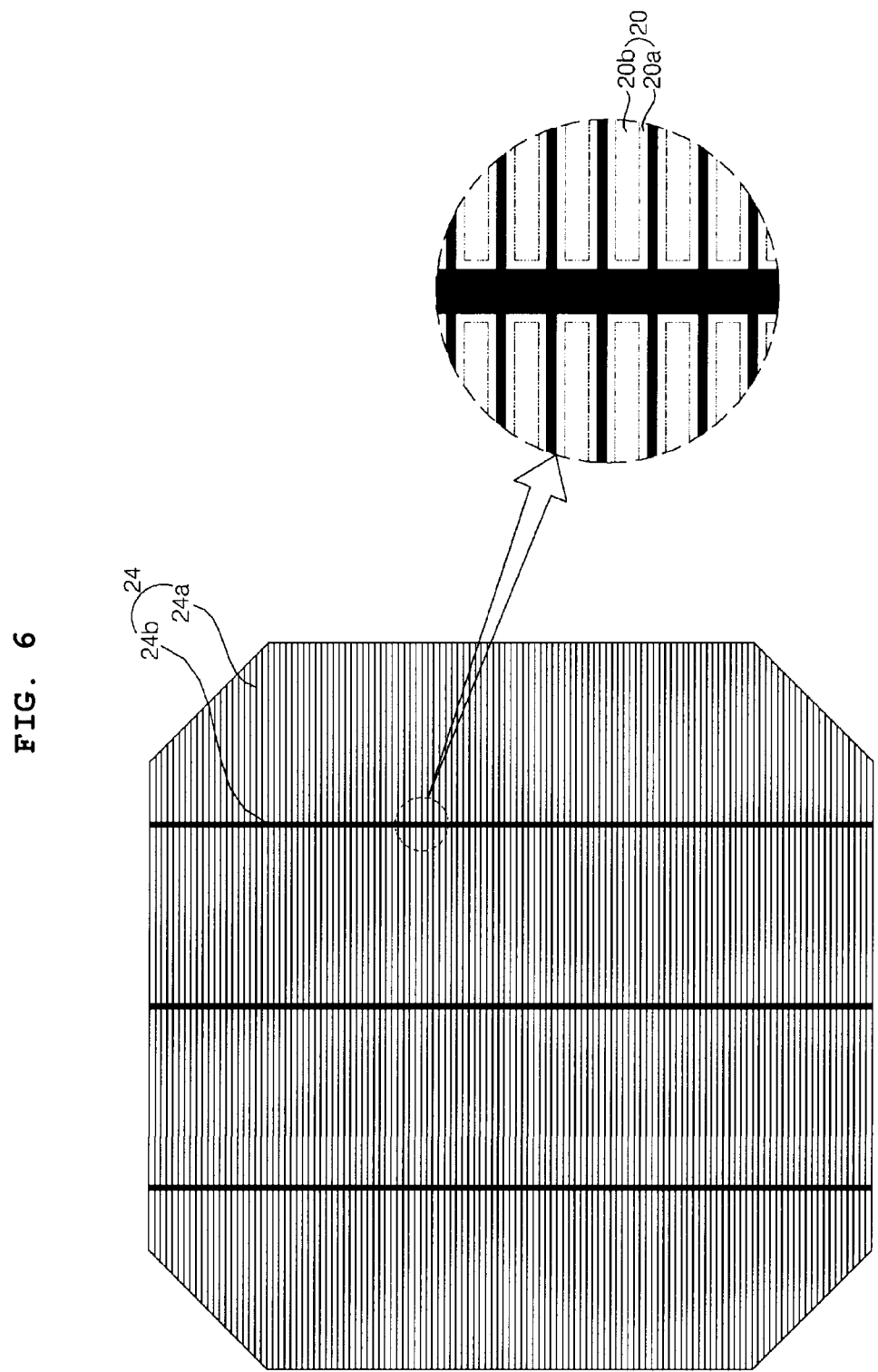
FIG. 6 is a plan view schematically illustrating a relation of a first electrode and an emitter layer of the solar cell shown in FIG. 5.

FIG. 5 is a cross-sectional view of a solar cell according to yet another embodiment of the present invention, and FIG. 6 is a plan view schematically illustrating a relation of a first electrode and an emitter layer of the solar cell shown in FIG. 5.

Referring to FIGS. 5 and 6, in the solar cell according to the embodiment, an emitter layer 20 as a first dopant layer has a selective emitter structure, and a back surface field layer 30 as a second dopant layer has a selective back surface field structure. Because the selective emitter structure and the selective back surface field structure were described in detail, the detailed descriptions will be omitted.

In the embodiment, the first counter dopant 204 is not doped to the entire emitter layer 20 with a uniform doping amount. That is, the first counter dopant 204 is doped to have different doping amount or doping concentration at different portions, or the first counter dopant 204 is partially doped. For example, the first counter dopant 204 is not doped to the first portion 20a of the emitter layer 20, and is doped to the second portion 20b of the emitter layer 20. Then, the surface concentration is reduced at the second portion 20b only. In order to form the above-structured emitter layer 20, a mask (not shown) for covering the first portion 20a may be used at the doping of the first counter dopant 204.

That is, since the first counter dopant 204 is not included at the first portion 20a, the surface concentration at the first portion 20a is relatively high and the resistance at the first portion 20a can be reduced. Thus, the contact resistance with the first electrode 24 can be reduced. Also, since the first counter dopant 204 is included at the second portion 20b, the surface concentration at the second portion 20b can be reduced and the surface recombination can be effectively prevented. That is, in the embodiment, the concentration of the first counter dopant 204 at the first portion 20a and the second portion 20b is different, and thus, effects of the selective emitter structure can be maximized.

In the embodiment, the second counter dopant 304 is not doped to the entire back surface field layer 30 with a uniform doping amount. That is, the second counter dopant 304 is doped to have different doping amount or doping concentration at different portions, or the second counter dopant 304 is partially doped. For example, the second counter dopant 304 is not doped to the first portion 30a of the back surface field layer 30, and is doped to the second portion 30b of the back surface field layer 30. Then, the surface concentration is reduced at the second portion 30b only. In order to form the above-structured back surface field layer 30, a mask (not shown) for covering the first portion 30a may be used at the doping of the second counter dopant 304.

That is, since the second counter dopant 304 is not included at the first portion 30a, the surface concentration at the first portion 30a is relatively high and the resistance at the first portion 30a can be reduced. Thus, the contact resistance with the first electrode 24 can be reduced. Also, since the second counter dopant 304 is included at the second portion 30b, the surface concentration at the second portion 30b can be reduced and the surface recombination can be effectively prevented. That is, in the embodiment, the concentration of the second counter dopant 304 at the first portion 30a and the concentration of the second counter dopant 304 at the second portion 30b are different, and thus, effects of the selective back surface field structure can be maximized.

In the embodiment, both of the emitter layer 20 and the back surface field layer 30 have selective structures. However, the invention is not limited thereto. Thus, only one of the emitter layer 20 and the back surface field layer 30 may have a selective structure.

Also, in the embodiment, the first portions 20a and 30a of the emitter layer 20 and the back surface field layer 30 do not include the first and second counter dopant 204 and 304, respectively. However, the invention is not limited thereto. Thus, only one of the emitter layer 20 and the back surface field layer 30 does not include the first or second counter dopant 204 or 304. Also, at least one of the first portions 20a and 30a of the emitter layer 20 and the back surface field layer 30 may include the first or second counter dopant 204 or 304 with a doping concentration or a doping amount less than that at the second portions 20b and 30b.

For example, the first portions 20a and 30a of the emitter layer 20 and the back surface field layer 30 may have sheet resistance of about 10~100 ohm/square (for example, about 20~60 ohm/square), and may have a thickness of about 0.5 μm or more (for example, 0.5~1.5 μm). The second portions 20b and 30b of the emitter layer 20 and the back surface field layer 30 may have sheet resistance of about 40~200 ohm/square (for example, 60~150 ohm/square), and may have a thickness smaller than about 0.5 μm (for example, a thickness of about 0.01 μm or less and smaller than about 0.5 μm). However, the invention is not limited thereto. Thus, the sheet resistance and the thickness of the emitter layer 20 and the back surface field layer 30 may be changed.

Hereinafter, embodiments of the invention will be described in more detail through experimental examples. The experimental examples are provided only for illustrating the embodiments of the invention and the embodiments of the invention are not limited thereto.

Experimental Embodiment 1

An n-type semiconductor substrate was prepared. Boron was doped to a front surface of the semiconductor substrate by an ion-implantation method, phosphorus was doped to a back surface of the semiconductor substrate by an ion-implantation method, and phosphorus was doped to the front surface of the semiconductor substrate by an ion-implantation method. A ratio of a doping amount of the phosphorous at the front surface: a doping amount of the boron at the front surface was 1:30. An ion-implanting energy of the phosphorous at the front surface was less than an ion-implanting energy of the boron. The semiconductor substrate was heat-treated for activation for 20 minutes at 1000° C.

An anti-reflection layer was formed on the front surface of the semiconductor substrate, and a second passivation layer was formed on the back surface of the semiconductor substrate. A first electrode electrically connected to an emitter layer and a second electrode electrically connected to aback surface field layer were formed to manufacture a solar cell.

Experimental Embodiment 2

A solar cell was manufactured by the same method in Experimental Embodiment 1 except that the doping amount of the phosphorous at the front surface is five times that in Experimental Embodiment 1.

Experimental Embodiment 3

A solar cell was manufactured by the same method in Experimental Embodiment 1 except that the doping amount of the phosphorous at the front surface is ten times that in Experimental Embodiment 1.

Experimental Embodiment 4

A solar cell was manufactured by the same method in Experimental Embodiment 1 except that an ion-implanting energy of the phosphorus at the front surface is twice that in Experimental Embodiment 1. Accordingly, the ion-implanting energy of the phosphorus at the front surface was the substantially same as the ion-implanting energy of the boron at the front surface.

Experimental Embodiment 5

A solar cell was manufactured by the same method in Experimental Embodiment 1 except that the ion-implanting energy of the phosphorus at the front surface is five times that in Experimental Embodiment 4.

Experimental Embodiment 6

A solar cell was manufactured by the same method in Experimental Embodiment 1 except that that the ion-implanting energy of the phosphorus at the front surface is ten times that in Experimental Embodiment 4.

COMPARATIVE EXAMPLE

A solar cell was manufactured by the same method in Experimental Embodiment 1 except that the phosphorus was not doped to the front surface of the semiconductor substrate.

Figure 7:
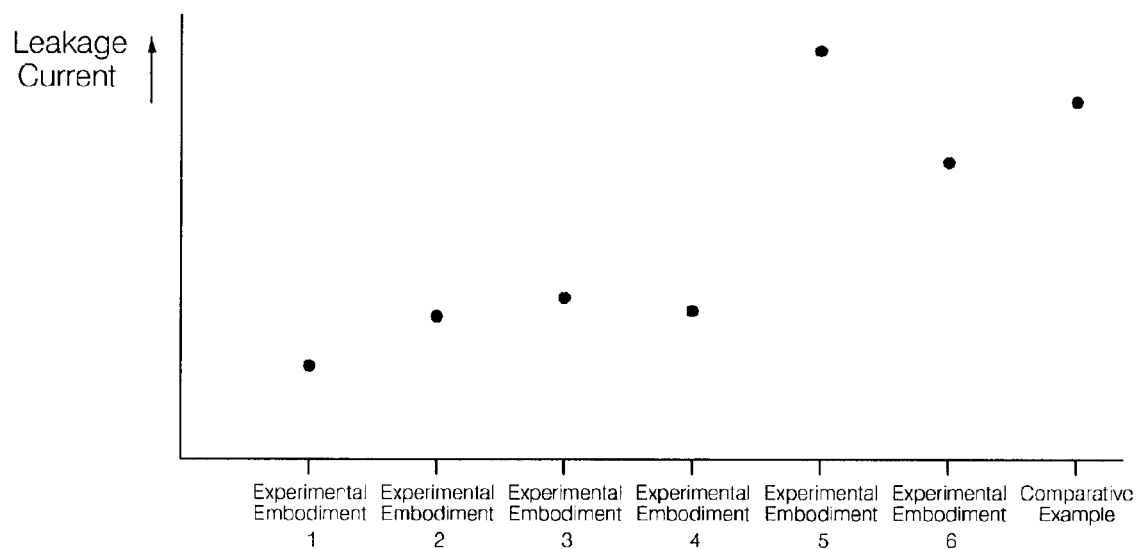
FIG. 7 is a graph illustrating leakage current (Joe) of solar cells manufactured by Experimental Embodiments 1 to 6 and Comparative Example.
Figure 8:
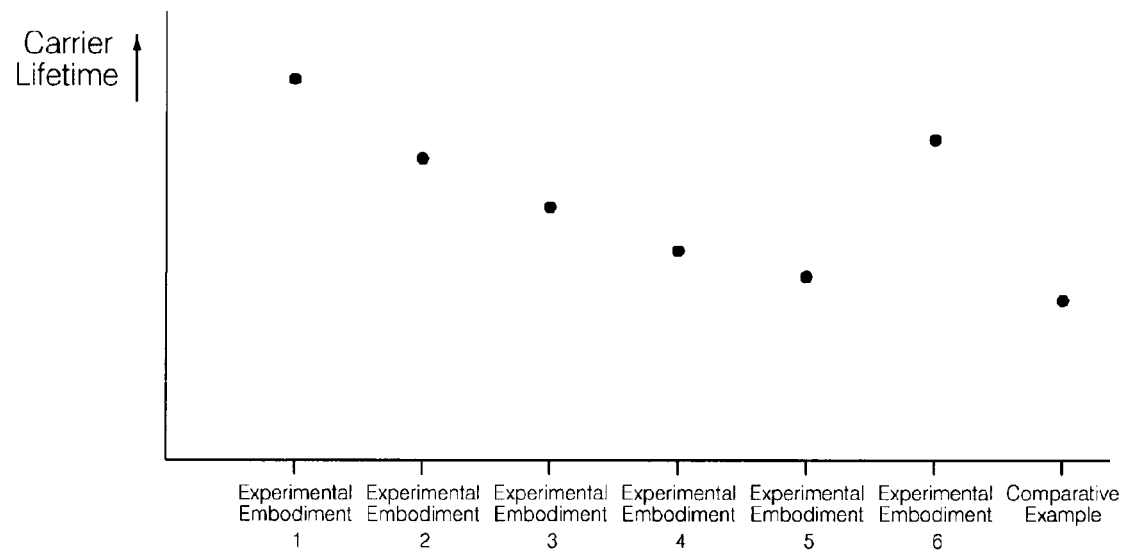
FIG. 8 is a graph illustrating carrier lifetime of solar cells manufactured by Experimental Embodiments 1 to 6 and Comparative Example.

Leakage current (Joe) of the solar cells manufactured by Experimental Embodiments 1 to 6 and Comparative Example are shown in FIG. 7. Carrier lifetime of the solar cells manufactured by Experimental Embodiments 1 to 6 and Comparative Example are shown in FIG. 8. Open circuit voltage of the solar cells manufactured by Experimental Embodiments 1 to 6 and Comparative Example are shown in FIG. 9.

Referring to FIG. 7, it can be seen that the solar cells manufactured by Experimental Embodiments 1 to 4, and 6 had small leakage current. The result of the solar cell manufactured by Experimental Embodiment 5 was strange, and it is predicted to be induced due to the defects generated at the manufacturing process. Referring to FIG. 8, it can be seen that the solar cells manufactured by Experimental Embodiments 1 to 6 had long carrier lifetime. That is, in the solar cells manufactured by Experimental Embodiments 1 to 6, it can be seen that the surface recombination was effectively prevented. Referring to FIG. 9, it can be seen that the solar cells manufactured by Experimental Embodiments 1 to 6 had large open circuit voltage, and thus, had superior properties.

Figure 9:
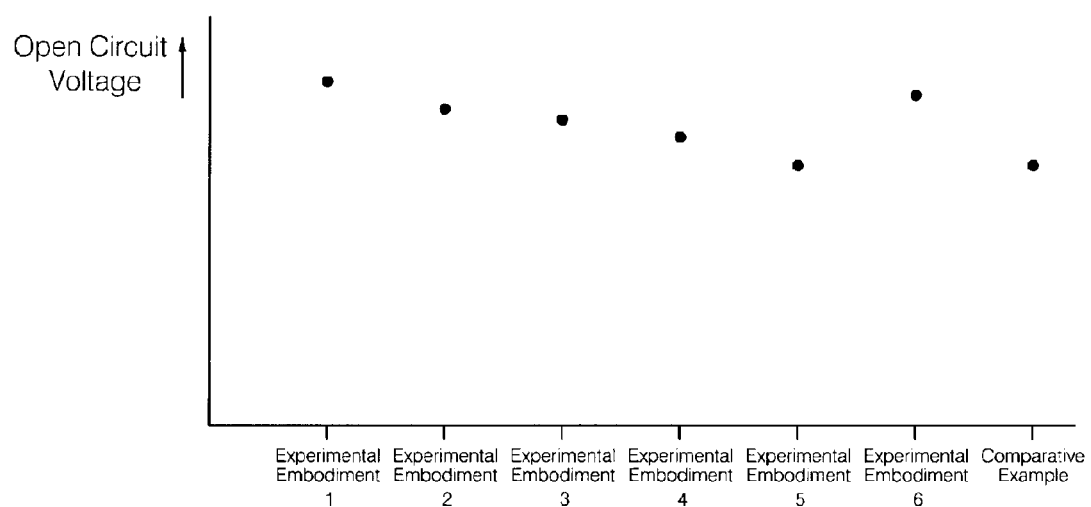
FIG. 9 is a graph illustrating open circuit voltage of solar cells manufactured by Experimental Embodiments 1 to 6 and Comparative Example.

Also, referring to FIGS. 7 to 9, it can be seen that the solar cells according to Experimental Embodiments 1 to 3 having relatively low ion-implanting energy of the phosphorus had properties better than the solar cells according to Experimental Embodiments 4 to 6. Also, it can be seen that the properties are enhanced more as the dopant amount of the phosphorus at the front surface decreases.

Certain embodiments of the invention have been described. However, the invention is not limited to the specific embodiments described above; and various modifications of the embodiments are possible by those skilled in the art to which the invention belongs without leaving the scope defined by the appended claims.

What is claimed is:

1. A method of manufacturing a solar cell, comprising:
forming a dopant layer to a first surface of a semiconductor substrate including a base dopant by doping a dopant of a first conductive type and a counter dopant of a second conductive type opposite to the first conductive type, wherein a doping amount of the counter dopant is less than a doping amount of the dopant of the first conductive type;
simultaneously activating the dopant of the first conductive type and the counter dopant of the second conductive type by a same heat-treatment process after forming the dopant layer; and
forming an electrode electrically connected to the dopant layer after activating the dopant of the first conductive type and the counter dopant of the second conductive type;
wherein the counter dopant is counter to the dopant of the first conductive type.

2. The method according to claim 1, further comprising:
doping entirely the dopant layer with the dopant of the first conductive type; and
doping a part of the dopant layer with the counter dopant of the second conductive type.

3. The method according to claim 1, wherein a ratio of the doping amount of the counter dopant of the second conductive type to the doping amount of the dopant of the first conductive type is 1:3 to 1:30.

4. The method according to claim 1, further comprises doping the dopant of the first conductive type and the counter dopant of the second conductive type by an ion-implantation method, wherein an ion-implanting energy of the counter dopant of the second conductive type is less than an ion-implanting energy of the dopant of the first conductive type.

5. The method according to claim 1, wherein the dopant layer to the first surface of the semiconductor substrate comprises a first portion adjacent to the electrode and a second portion other than the first portion, the method comprises doping the counter dopant of the second conductive type to the second portion and not to the first portion.

6. The method according to claim 1, wherein the dopant layer to the first surface of the semiconductor substrate comprises a first portion and a second portion other than the first portion, the method comprises doping a different amount of the counter dopant of the second conductive type to the first portion than the second portion.

7. The method according to claim 1, wherein the dopant layer to the first surface of the semiconductor substrate comprises a first portion adjacent to the electrode and a second portion other than the first portion, the method comprising:
  doping the dopant of the first conductive type to the first portion to be higher than the second portion; and
  uniformly doping the counter dopant of the second conductivity type to the first portion and the second portion.

8. The method according to claim 1, wherein the dopant layer to the first surface of the semiconductor substrate comprises a first portion adjacent to the electrode and a second portion other than the first portion, the method comprises forming the second portion to be more shallow than the first portion.

9. The method according to claim 1, further comprising:
  forming another dopant layer to a second surface of the semiconductor substrate by doping a dopant of a second conductivity type and a counter dopant of a first conductivity type opposite to the second conductivity type, wherein a doping amount of the counter dopant of the first conductivity type is less than a doping amount of the dopant of the second conductivity type; and
  forming another electrode electrically connected to the another dopant layer.

10. The method according to claim 9, further comprising:
  doping entirely the another dopant layer to the second surface of the semiconductor substrate with the dopant of the second conductive type; and
  doping a part of the another dopant layer to the second surface of the semiconductor substrate with the counter dopant of the first conductive type.

11. The method according to claim 9, wherein a ratio of the doping amount of the counter dopant of the first conductive type to the doping amount of the dopant of the second conductive type is 1:3 to 1:30.

12. The method according to claim 9, further comprises doping the dopant of the second conductive type and the counter dopant of the first conductive type by an ion-implantation method, wherein an ion-implanting energy of the counter dopant of the first conductive type is less than an ion-implanting energy of the dopant of the second conductive type.

13. The method according to claim 9, wherein the another dopant layer to the second surface of the semiconductor substrate comprises a first portion adjacent to the another electrode and a second portion other than the first portion, the method comprises doping the counter dopant of the first conductive type to the second portion and not to the first portion.

14. The method according to claim 9, wherein the another dopant layer to the second surface of the semiconductor substrate comprises a first portion and a second portion other than the first portion, the method comprises doping a different amount of the counter dopant of the first conductive type to the first portion than the second portion.

15. The method according to claim 9, wherein the another dopant layer to the second surface of the semiconductor substrate comprises a first portion adjacent to the another electrode and a second portion other than the first portion, the method comprising:
  doping the dopant of the second conductive type to the first portion to be higher than the second portion; and
  uniformly doping the counter dopant of the first conductivity type to the first portion and the second portion.

16. The method according to claim 9, wherein the another dopant layer to the second surface of the semiconductor substrate comprises a first portion adjacent to the another electrode and a second portion other than the first portion, the method comprises forming the second portion to be more shallow than the first portion.

17. The method according to claim 9, further comprises activating the dopant of the second conductivity type and the counter dopant of the first conductivity type by a same heat-treatment process.

18. A method of manufacturing a solar cell, comprising:
  forming a dopant layer to a first surface of a semiconductor substrate including a base dopant by doping a dopant of a first conductive type and a counter dopant of a second conductive type opposite to the first conductive type, wherein a doping amount of the counter dopant is less than a doping amount of the dopant of the first conductive type; and
  forming an electrode electrically connected to the dopant layer after forming the dopant layer,
  wherein, while forming the dopant layer, the counter dopant is entirely doped to the first surface of the semiconductor substrate to be included in an entire portion of the dopant layer, and
  wherein the counter dopant is counter to the dopant of the first conductive type.

* * * * *